(12) United States Patent
Kusakabe et al.

(10) Patent No.: US 6,713,869 B2
(45) Date of Patent: Mar. 30, 2004

(54) WIRING PATTERN OF SEMICONDUCTOR DEVICE

(75) Inventors: Takeshi Kusakabe, Kanagawa-ken (JP); Toshitsune Iijima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/259,180

(22) Filed: Sep. 27, 2002

(65) Prior Publication Data

US 2003/0071364 A1 Apr. 17, 2003

(30) Foreign Application Priority Data

Sep. 27, 2001 (JP) .......................... 2001-298639

(51) Int. Cl.[7] .......................... H01L 23/48; H01L 23/52; H01L 29/40; H01L 21/44; H01L 21/48

(52) U.S. Cl. .......................... 257/734; 257/666; 257/698; 257/737; 257/784; 257/773; 257/786; 438/106; 438/108

(58) Field of Search .................. 438/106, 108; 257/734, 684, 698, 666, 691, 784, 786, 668, 737, 738, 673, 775, 773

(56) References Cited

U.S. PATENT DOCUMENTS 5,998,236 A * 12/1999 Roeder et al. ............... 438/104
6,160,313 A * 12/2000 Takashima et al. .......... 257/737
6,190,943 B1 * 2/2001 Lee et al. .................... 438/107
6,214,641 B1 * 4/2001 Akram ........................ 438/107
6,218,202 B1 * 4/2001 Yew et al. ..................... 438/15
6,271,056 B1 * 8/2001 Farnworth et al. .......... 438/106
6,300,163 B1 * 10/2001 Akram ........................ 438/108
6,300,165 B2 * 10/2001 Castro ......................... 438/118
6,326,700 B1 * 12/2001 Bai et al. ..................... 257/790
6,429,528 B1 * 8/2002 King et al. ................... 257/775
6,531,335 B1 * 3/2003 Grigg ........................... 438/106
6,537,850 B1 * 3/2003 Corisis ........................ 438/106
6,602,803 B2 * 8/2003 Yew et al. ................... 438/780
6,630,730 B2 * 10/2003 Grigg ........................... 257/684

FOREIGN PATENT DOCUMENTS

JP          05-211191          8/1993

* cited by examiner

*Primary Examiner*—Matthew Smith
*Assistant Examiner*—Chuong A Luu
(74) *Attorney, Agent, or Firm*—Hogan & Hartson, LLP

(57) ABSTRACT

A semiconductor package of this invention comprises an electrode pad arranged on a semiconductor chip, a bonding wire, an end of which is coupled to the electrode pad, and a connection pad arranged parallel to a direction of arrangement of the bonding wire, to which another end of the bonding wire is coupled, and a pitch of the connection pad is wider than that of the electrode pad.

6 Claims, 6 Drawing Sheets

(a)

(b)

(a)

(b)

WIRING PATTERN OF SEMICONDUCTOR DEVICE

CROSS-REFERENCE TO RELATED APPLICATIONS

This application is based upon and claims the benefit of priority from the prior Japanese Patent Application No. 2001-298639, filed Sep. 27, 2001, the entire contents of which are incorporated herein by reference.

BACKGROUND OF THE INVENTION

1. Field of the Invention

This invention is related to a wiring pattern of semiconductor device, precisely an arrangement of wiring pad on the printed board coupled to a semiconductor chip via bonding wire.

2. Description of the Related Art

Recently There is a demand for making a semiconductor device smaller and thinner. To ask this kind of demand, a chip-scale package is developed that a semiconductor chip which has the same size of a printed board is arranged on the board. Moreover, in a semiconductor device which is going to realize high-integrated, high-performance, high-capacity, it is used a small Ball-Grid-Array type semiconductor package. In this kind of package, a semiconductor chip is coupled to the board by wire bonding or beam-lead bonding.

FIG. 1 shows an schematic view of conventional semiconductor package. As shown in FIG. 1, semiconductor chip 1 has plurality of electrode pad 2. This semiconductor chip 1 is arranged on a sheet-shaped board 4 including opening 3, its surface semiconductor device is formed is faced to the board 4. At this point, the semiconductor chip 1 is arranged so as the electrode pad 2 to exposed from the opening 3. The semiconductor chip is bonded to the board 4 by adhesives 5, elastomer for instance.

FIG. 2 is a plan view of a bottom side of the semiconductor device shown in FIG. 1 and the electrode pad 2 and the wiring pattern 7 is magnified. As shown in FIG. 2 the wiring pattern 7 coupled to the external coupling terminal 8 includes a wiring line 7a and connection pad 7b nearby the opening 3. A pitch of the connection pad 7b is as same as that of the electrode pad 2. Consequently, this connection pad 7b is almost perpendicular to a direction of arrangement of the electrode pad 2. The connection pad 7b is coupled to the electrode pad 2 exposed from the opening 3 by bonding wire 6. This bonding wire 6 is also perpendicular to a direction of arrangement of the electrode pad 2.

BRIEF SUMMARY OF THE INVENTION

A semiconductor of this invention includes a electrode pad arranged on a semiconductor chip, a bonding wire, one end of which is coupled to said electrode pad, a connection pad, which another end of said bonding wire is coupled to, a pitch of which is larger than that of said electrode pad, and aligning parallel to a aligning direction of bonding wire.

DETAILED DESCRIPTION OF THE INVENTION

Figure 2:
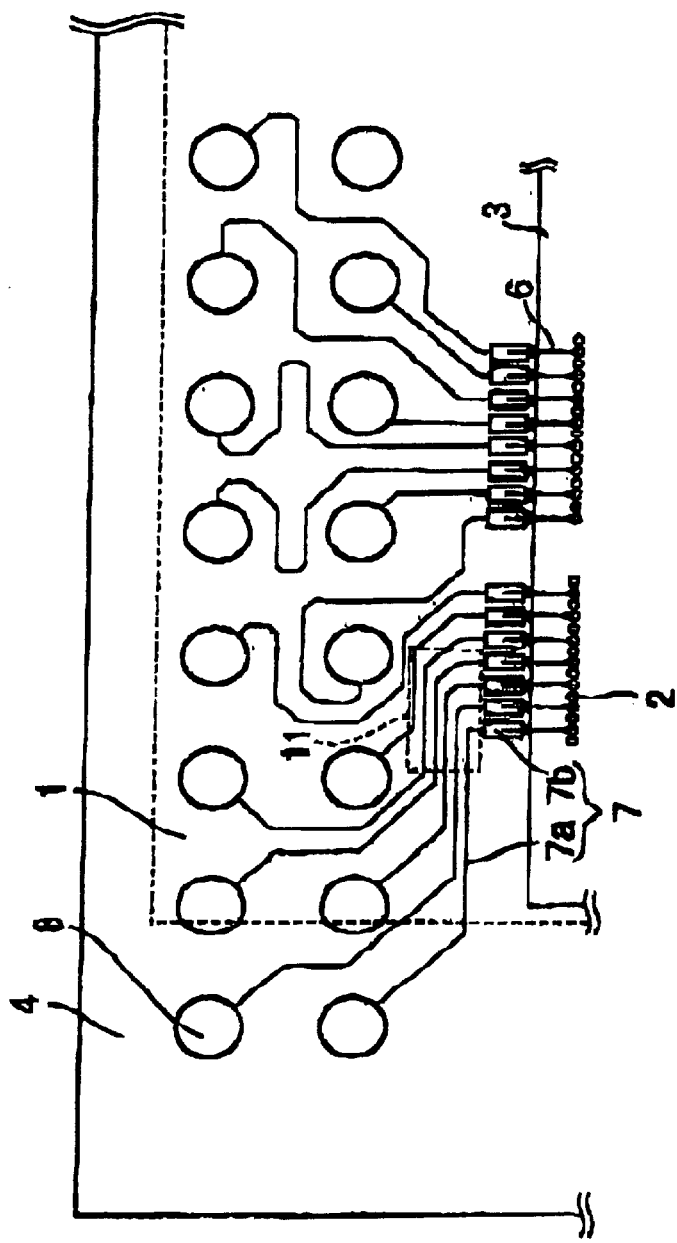
FIG. 2 is a plan view of an under surface of the conventional semiconductor package schematically.
Figure 3:
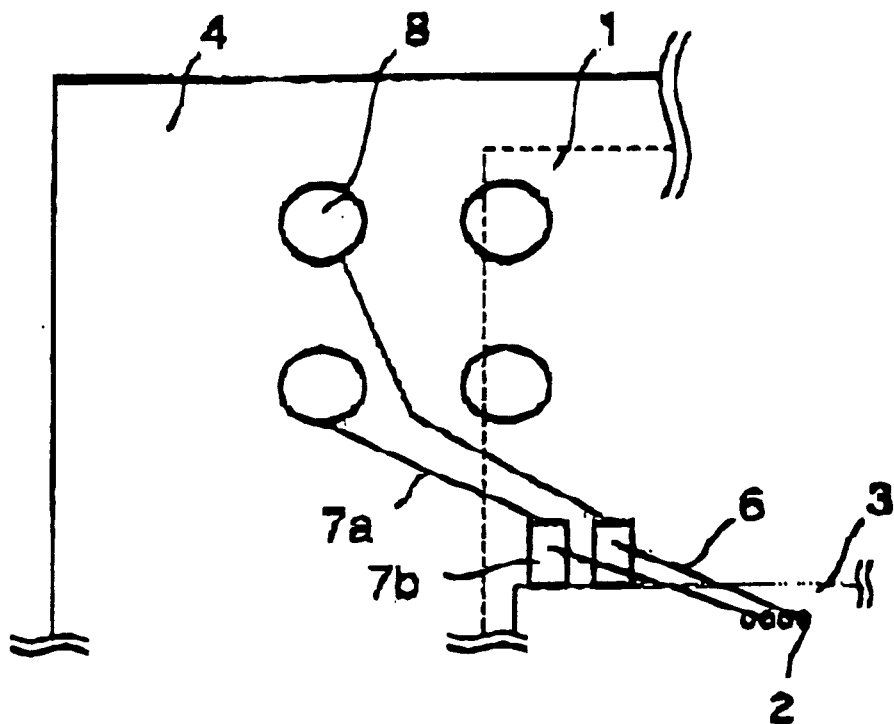
FIG. 3 shows a problem of a case that a row of the connection pad is made to long.

Inventors studies about a semiconductor package being able to avoid the wire portion 7a concentrating excessively. In the result, Inventors discovered the fact as below:

As shown in FIG. 3, a length of row of connection pad 7b is made longer than that of connection pad 7b shown in FIG. 2, or the connection pad 7b is arranged outside of an end of the electrode pad 2. Additionally, the wire portion 7a is bended, so that the wire portion 7a is coupled to the connection pad 7b. Consequently, the bonding wire 6 makes an angle to a direction which the electrode pad 2 is arranged.

As explained above, the wire line portion 7a is avoided to gathered. Accordingly, wire portion 7a is no need to be overfined so that it is avoided a resistance of the wire portion 7a is increased.

Figure 4:
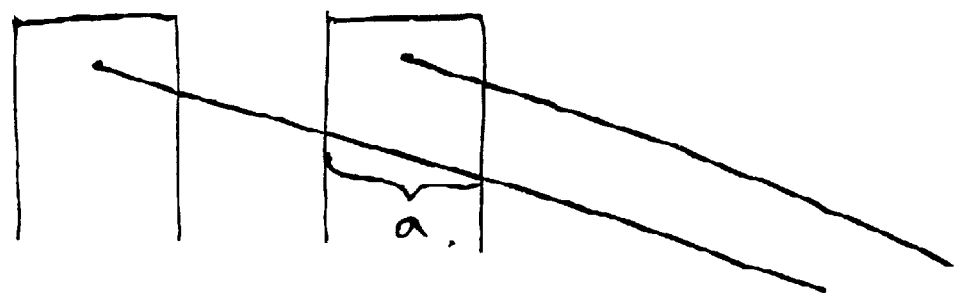
FIG. 4 shows that the bonding wire is happened to touch to the connection pad.

However, the semiconductor as above occurs problems as below. As shown in FIG. 4, the bonding wire 6 touches the connection pad 7b aligning the bonding pad 6 so that the bonding wire 6 is shortened, reliability is lowered.

Figure 5:
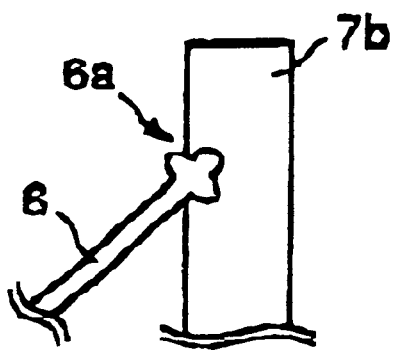
FIG. 5 shows a problem of a case that the direction that the connection pad aligns is not parallel to the direction that the bonding wire aligns.

FIG. 5 is an enlargement of the connection pad 7b and the bonding wire 6. The bonding wire 6 and the connection pad 7b are normally connected by an end 6a of the bonding wire 6 is pressed by, for example, capillary on the connection pad 7b. Accordingly, as shown in FIG. 5, the direction of bonding wire 6 being aligned is not equal to the direction of the connection pad 7b being aligned, it is occurred that a portion of the end 6a sticks out of the connection pad 7b. In the result, bonding wire 6 is connected to connection pad unstably.

Referring to the drawings, we are going to explain an embodiment of the invention constructed by the knowledge described above. According to an explanation as below, an element showing the same function and an element including the same element are referred the same code. Repeated explanation would be done if it is necessary.

Figure 1:
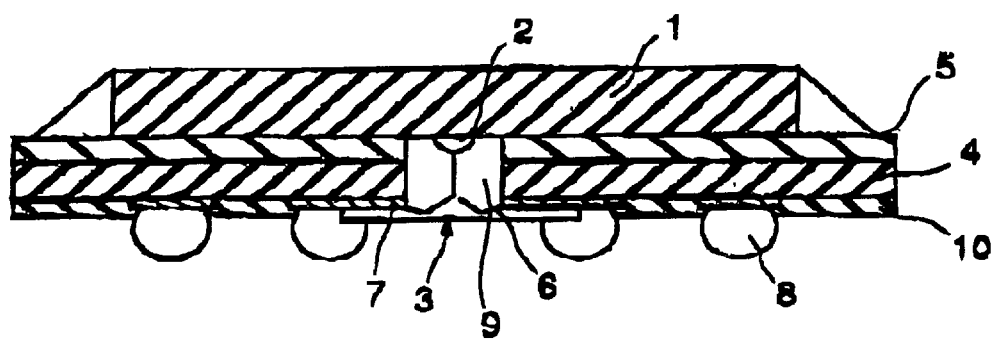
FIG. 1 shows a conventional semiconductor package and a semiconductor package of present invention schematically.
Figure 6:
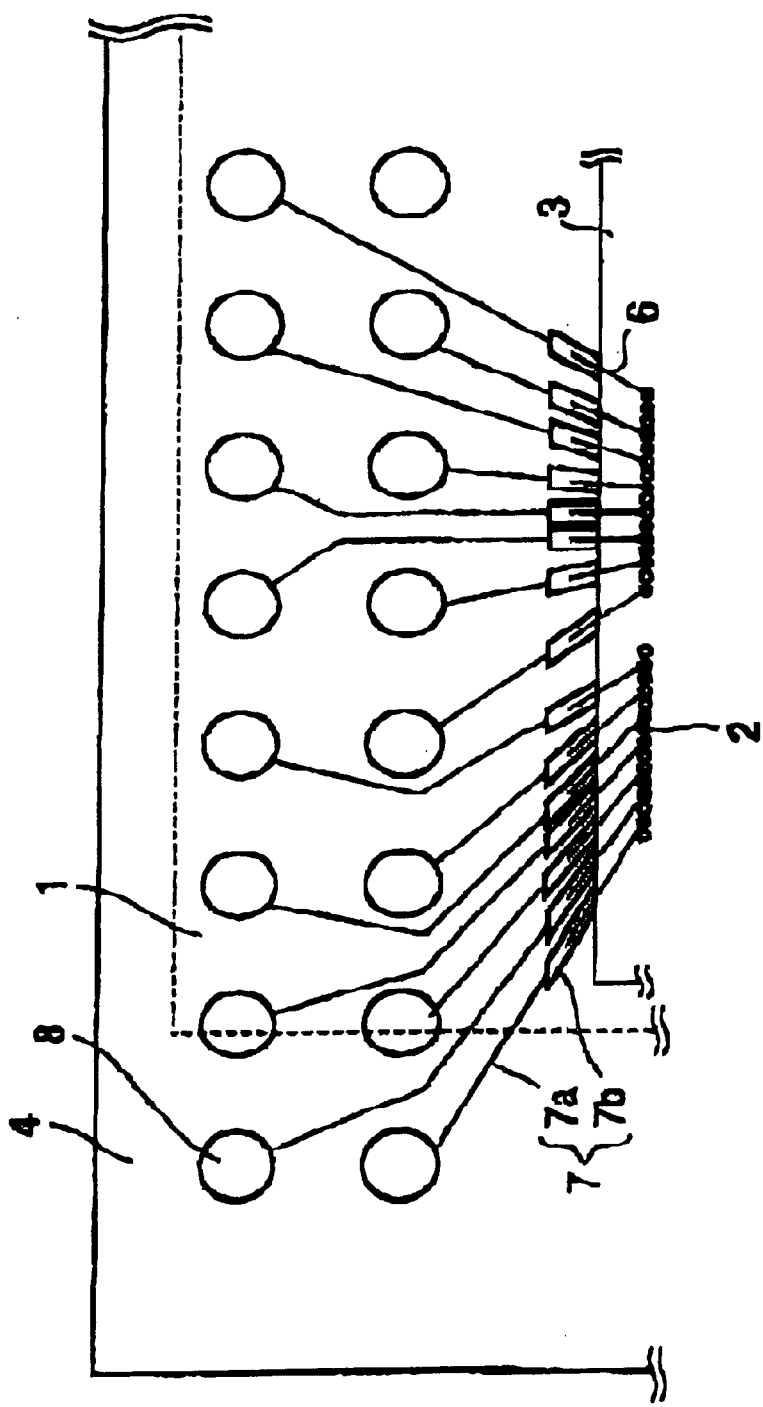
FIG. 6 is a plan view of an under surface of the semiconductor package of present invention schematically.
Figure 7:
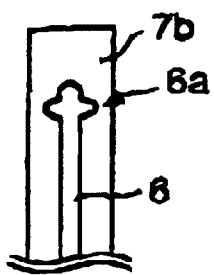
FIG. 7 shows a connection part of the connection pad and the bonding wire schematically.

FIG. 6 is a plan view of an under surface of the semiconductor package of present invention schematically, is enlarged plan view of electrode pad 2 and wiring pattern 7. Other elements of this semiconductor package are the same elements of the conventional semiconductor package as shown in FIG. 1, explanation will be omitted.

As shown in FIG. 6, a row of the electrode pad 2 arranged on the semiconductor chip 1 including, for example Fast-Cycle Random Access Memory, is exposed from an opening 3. The Fast-Cycle Random Access Memory is a RAM executing pipe-line action. A plurality of external connection terminal 8 is arranged like zigzag (grating) pattern. The wiring pattern 7 coupled to the external connection terminal 8 is placed nearby plurality of the wire portion 7a and the opening 3, constructed plurality of the connection pad 7b whose area is larger than an area of the wire portion 7a. The connection pad 7b is coupled to the electrode pad 2 by the bonding wire 6.

The connection pad 7b is arranged in a row, an interval between the connection pad 7b is larger than an interval between the electrode pad 2. Accordingly, a longitudinal length of the row of the connection pad 7b is longer than that of the electrode pad 2. Also, the electrode pad 2 is arranged perpendicular to the bonding wire 6 in a predetermined distance, aligning a longitudinal direction of the bonding wire 6, and aligning an outline of a fan shape. Accordingly, each of the bonding wire 6 and connection pad 7b is formed a different angle with the direction of arrangement of the electrode pad 2.

An interval of the bonding wire 6 is narrower as it is got closer to the electrode pad 2. Each bonding wire 6 is generally different meeting an interval between the electrode pad 2 and connection pad 7b. A bonding wire arranged at the end of the fan shape is longer than a bonding wire arranged at the center of the fan shape.

According to the embodiment, a length of longitudinal direction of the row of connection pad 7b is longer than that of the electrode pad 2. And the electrode pad 2 is arranged with a predetermined length to a longitudinal direction of the bonding wire 6. Consequently, it is avoided bonding wire 6 to touch the connection pad 7b aligned nearby the bonding wire 6.

Moreover, bonding wire 6 and connection pad 7b are formed same direction each other. Accordingly, when the bonding wire 6 is adhered on the connection pad 7b, as shown in FIG. 5, it is avoided a part of the bonding wire 6 to stick out from the connection pad 7b. Accordingly, a reliance of a semiconductor package is improved.

Figure 8:
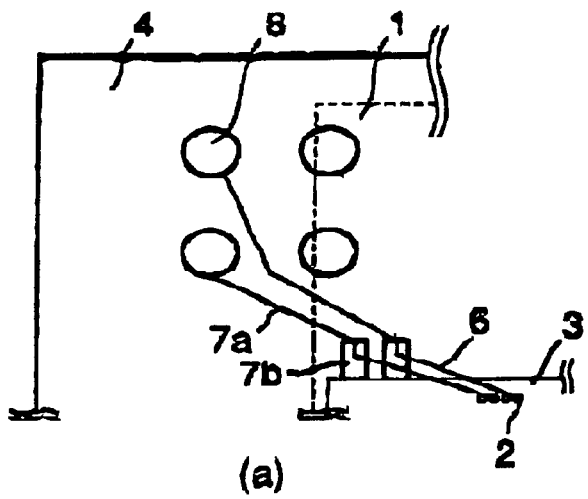
FIG. 8 shows a current path of the semiconductor package of present invention schematically.
Figure 8:
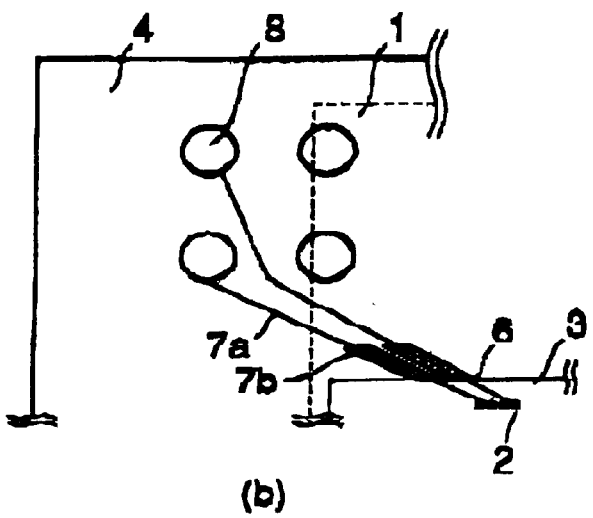

FIG. 8(*a*) shows a current path in the case connection pad 7b is arranged in a direction of the arrangement of the electrode pad 2, and FIG. 8(*b*) shows a current path shown in the embodiment of this invention. The current path shown in FIG. 8(*a*) is comparatively longer on the connection pad 7b because the wire portion 7a is not on an expansion of the bonding wire 6. This is inconvenient for recent semiconductor device needed high-speed action. Comparing to this, as shown in FIG. 8(*b*), the current path of this embodiment is shortest length because the wire portion 7a is on an expansion of the bonding wire 6. Consequently, a speed of action of semiconductor device is capable of improving.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor packages, comprising:

a substrate including an opening;

a wiring pattern including plurality of wire portions arranged on said substrate;

connection pads coupled near the opening to an end of said wire portions;

a semiconductor chip including plurality of electrode pads disposed in a line, and arranged on said substrate so that said electrode pads expose from said opening; and plurality of bonding wires coupled to said connection pads and said electrode pads, wherein said connection pads are disposed at a non-right angle with respect to the line and are coupled to said bonding wires so that a direction that said connection pads align are substantially parallel to a direction that said bonding wires aligns, and a spacing interval between the bonding wires is narrower as the bonding wires approach the electrode pads.

2. The semiconductor package according to claim 1, further comprising:

a plurality of external connection terminals formed on said substrate, said external connection terminals arranged in a zigzag-shared pattern.

3. The semiconductor package according to claim 1, wherein said connection pads are disposed in end areas and in center areas disposed between said end areas, and wherein said bonding wires that are coupled to connection pads disposed in the end areas are longer than said bonding wires that are disposed in said end areas.

4. The semiconductor package according to claim 1, wherein said bonding wires are prevented from touching said connection pads except at an end of said connection pads.

5. The semiconductor package according to claim 1, wherein said connection pads are arranged at a center of said semiconductor chip.

6. The semiconductor package according to claim 1, wherein said semiconductor chip is Fast-Cycle Random Access Memory.

* * * * *